(12) United States Patent
Lin et al.

(10) Patent No.: US 7,782,142 B2
(45) Date of Patent: Aug. 24, 2010

(54) HIGH SPEED DIFFERENTIAL TO SINGLE ENDED CONVERTING CIRCUIT

(75) Inventors: Inn-Fu Lin, Taipei (TW); Wen-Ching Hsiung, Hsinchu (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/475,857

(22) Filed: Jun. 1, 2009

(65) Prior Publication Data

US 2009/0295481 A1    Dec. 3, 2009

(30) Foreign Application Priority Data

Jun. 2, 2008    (TW) .............................. 97120482 A

(51) Int. Cl.
  *H03F 3/04*    (2006.01)
(52) U.S. Cl. ...................................... 330/301; 330/116
(58) Field of Classification Search ................ 330/301, 330/116, 9; 327/124, 307
  See application file for complete search history.

(56) References Cited

U.S. PATENT DOCUMENTS

| | | | |
|---|---|---|---|
| 5,508,836 A * | 4/1996 | DeCaro et al. | 398/202 |
| 5,828,476 A * | 10/1998 | Bonebright et al. | 398/136 |
| 6,717,474 B2 | 4/2004 | Chen et al. | |
| 7,053,671 B1 | 5/2006 | Wong | |
| 7,536,114 B2 * | 5/2009 | Gieseler et al. | 398/210 |
| 7,733,169 B2 * | 6/2010 | Zhang et al. | 330/9 |

\* cited by examiner

*Primary Examiner*—Henry K Choe
(74) *Attorney, Agent, or Firm*—Winston Hsu

(57) ABSTRACT

A differential to single ended converting circuit includes a transconductance circuit having input terminals for receiving differential input voltages and having a first current output terminal for outputting a first current and a second current output terminal for outputting a second current; an offset cancellation circuit having a first controllable current source connected to the first current output terminal and a second controllable current source connected to the second current output terminal; a first transimpedance circuit having an input terminal connected to the first current output terminal and an output terminal for outputting a first voltage; a second transimpedance circuit having an input terminal connected to the second current output terminal and an output terminal for outputting a second voltage; and a first inverter having an input terminal connected to the output terminal of the first transimpedance circuit and an output terminal for outputting a first single ended output voltage.

15 Claims, 10 Drawing Sheets

HIGH SPEED DIFFERENTIAL TO SINGLE ENDED CONVERTING CIRCUIT

FIELD OF THE INVENTION

The present invention relates to a signal converting circuit, and more particularly to a high speed differential to single ended converting circuit.

BACKGROUND OF THE INVENTION

Refer to FIG. 1, which illustrates a conventional differential to single ended converting circuit. The differential to single ended converting circuit comprises a first p type transistor mp1, having a source connected to a voltage source Vdd, a gate and a drain which are connected to each other, a first n type transistor mn1, having a drain connected to the drain of the first p type transistor mp1, and a source connected a current source I, a second p type transistor mp2, having a source connected to the voltage source Vdd, a gate and a drain which are connected to each other, and a second n type transistor mn2, having a drain connected to the drain of the first p type transistor mp2. In addition, the gate of the first n type transistor mn1 and the gate of the second n type transistor mn2 are coupled to differential signals Vin and Vinb respectively.

The differential to single ended converting circuit further comprises a third p type transistor mp3, having a source connected to the voltage source Vdd, and a gate connected to the gate of the first p type transistor mp1 so that a first current mirror (mp1 and mp3) is formed, a third n type transistor mn3, having a drain and a gate both connected to the drain of third p type transistor mp3, and a source connected to a ground, a fourth p type transistor mp4, having a source connected to the voltage source Vdd, and a gate connected to the gate of the second p type transistor mp2 so that a second current mirror (mp2 and mp4) is formed, and a fourth n type transistor mn4, having a drain connected to the drain of the fourth p type transistor mp4, a gate connected to the ground, and a gate connected to the gate of the third n type transistor mn3 so that a third current mirror (mn3 and mn4) is formed. In addition, a parasitic capacitor Cp is coupled to the drain of the fourth n type transistor mn4 and the ground, and the drain of the fourth n type transistor mn4 is as the output terminal Vout of the differential to single ended signal converting circuit When the differential signals Vin, Vinb is inputted, the currents in and ip flow through the first n type transistor mn1 and the second n type transistor mn2 respectively as shown in FIG. 1. The first p type transistor mp1 and the third p type transistor mp3 form the first current mirror, the second p type transistor mp2 and the fourth p type transistor mp4 form the second current mirror, and the third n type transistor and the fourth n type transistor form the third current mirror, the output current from the output terminal Vout is therefore in plus ip.

The circuit in FIG. 1 is a differential current to voltage converting circuit. Moreover, the differential current in flows through the third p type transistor mp3, the third n type transistor mn3, and the fourth n type transistor mn4 while the differential current ip only flows through the fourth p type transistor mp4. The different numbers of transistor the differential currents in and ip flow leads to the mismatch of the differential currents in and ip which results in jitter and common-mode drift of the output voltage Vout. In addition, to operate the converting circuit operated in high speed, GHz frequency, diode connected transistors, i.e. the first p type transistor mp1, the second p type transistor mp2, and the third n type transistor mp3 must be prevented from turning off. And the first p type transistor mp1, the second p type transistor mp2 and the third n type transistor mn3 require larger size and higher transconductance, i.e. higher gmp1, gmp2 and gmn3.

Moreover, U.S. Pat. No. 6,717,474 discloses a high-speed differential to single-ended converter. Refer to FIG. 2, which illustrates a conventional differential to single ended converter. A differential voltage signal ($V_{in}, V_{inb}$) is provided to a first stage circuit which is comprised of M1, M2, M3 and M4 and a differential current signal (I1 and I2) is obtained. In addition, a second stage circuit comprises a current mirror and a buffer circuit so that the differential current signal (I1 and I2) is converted to an single ended current signal I3 which is I1 plus I2. At last, a single ended current signal I3 is provided to a third stage circuit, a trans-impedance circuit, so that the single ended current signal I3 is converted to a output voltage Vout.

The ninth transistor M9 is a diode connected transistor as shown in FIG. 2. To prevent the ninth transistor M9 from turning off, the differential current signal (I1 and I2) when switing are prevented from being zero. Therefore, a resistor Re is added in the first stage circuit so that the differential current signal (I1 and I2) would not be zero when switching.

Moreover, high input impedance is transferred to low output impedance by the seventh transistor M7 and the eighth transistor M8 of the second stage circuit to enhance the operation speed. In addition, the bias voltage Vb3 is to be adjusted with caution because the seventh transistor M7 and the eighth transistor M8 are for providing high transconductance gm7, gm8 respectively.

Furthermore, the dc bias of the output terminal of the second stage circuit is ⅔ VDD because there are three transistors connected from the voltage source VDD to the ground GND, while the transition point of the input terminal of the third stage circuit is ½ VDD. Hence, the distortion of the output voltage Vout occurs after the second stage circuit and the third stage circuit are connected.

What is more, U.S. Pat. No. 7,053,671 discloses a low-jitter differential-to-single-ended data conversion circuit. Refer to FIG. 3, which illustrates a low-jitter differential-to-single-ended data conversion circuit. The first p type transistor mp1 and the second p type transistor mp2 of FIG. 1 are replaced with resistors Rd as shown in FIG. 3 to effectively lower impedance value. Besides, the transistor 62 is connected to a load device, i.e. transistor 68.

To prevent the transistor 62 which is a diode connected transistor from being turned off, a voltage source Vcc is connected to the gate of the transistor 62 by way of the transistor 68, i.e. the load device. The transistor 62 is thus prevented from turning off so that the operation speed of the conversion circuit is up, However, the conversion circuit which comprises the load device requires more power consumption.

SUMMARY OF THE INVENTION

It is an object of the present invention is to provide a high speed differential to single ended converting circuit without diode connected transistors.

In order to attain the foregoing object, a claimed invention provides a differential to single ended converting circuit which comprises a transconductance circuit having two input terminals for receiving two differential input voltages and having a first current output terminal for outputting a first current and a second current output terminal for outputting a second current; an offset cancellation circuit having a first controllable current source connected to the first current output terminal and a second controllable current source connected to the second current output terminal; a first transimpedance circuit having an input terminal connected to the first current output terminal and an output terminal for outputting a first voltage; a second transimpedance circuit having an input terminal connected to the second current output terminal and an output terminal for outputting a second voltage; and a first inverter having an input terminal connected to the output terminal of the first transimpedance circuit and an output terminal for outputting a first single ended output voltage.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

Figure 1:
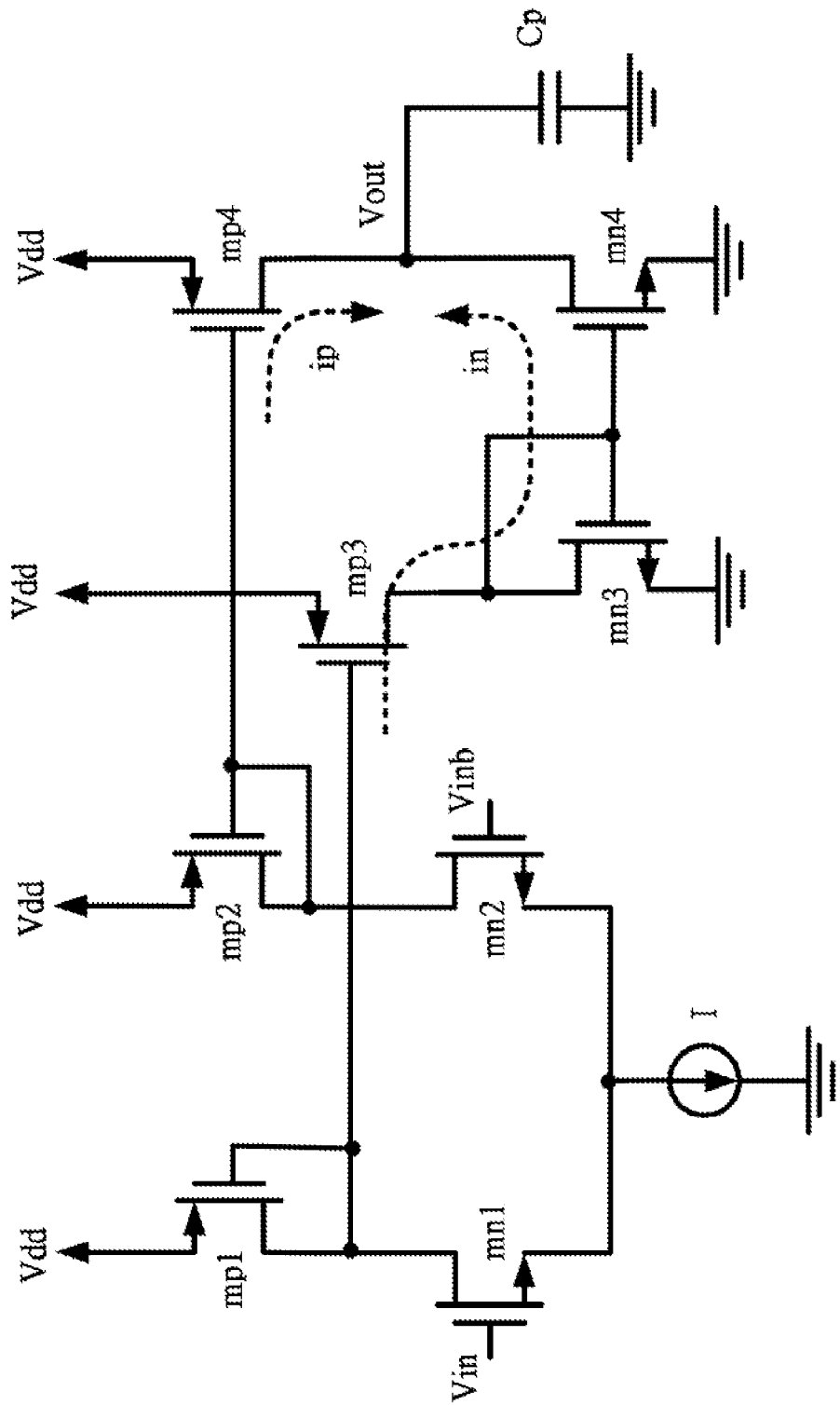
FIG. 1 is a diagram illustrating a conventional differential to single ended converting circuit.
Figure 2:
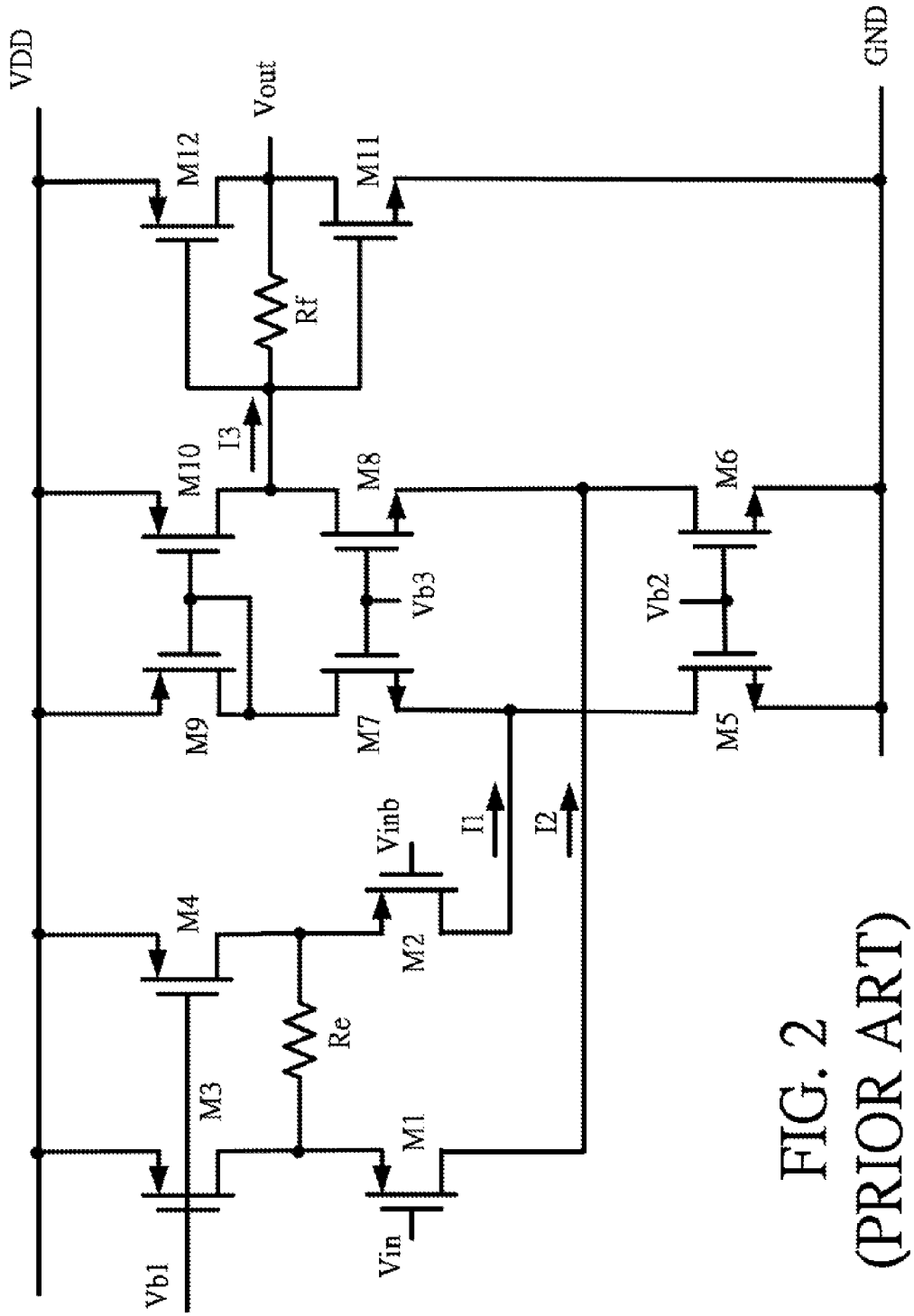
FIG. 2 is a diagram illustrating a conventional differential to single ended converter.
Figure 3:
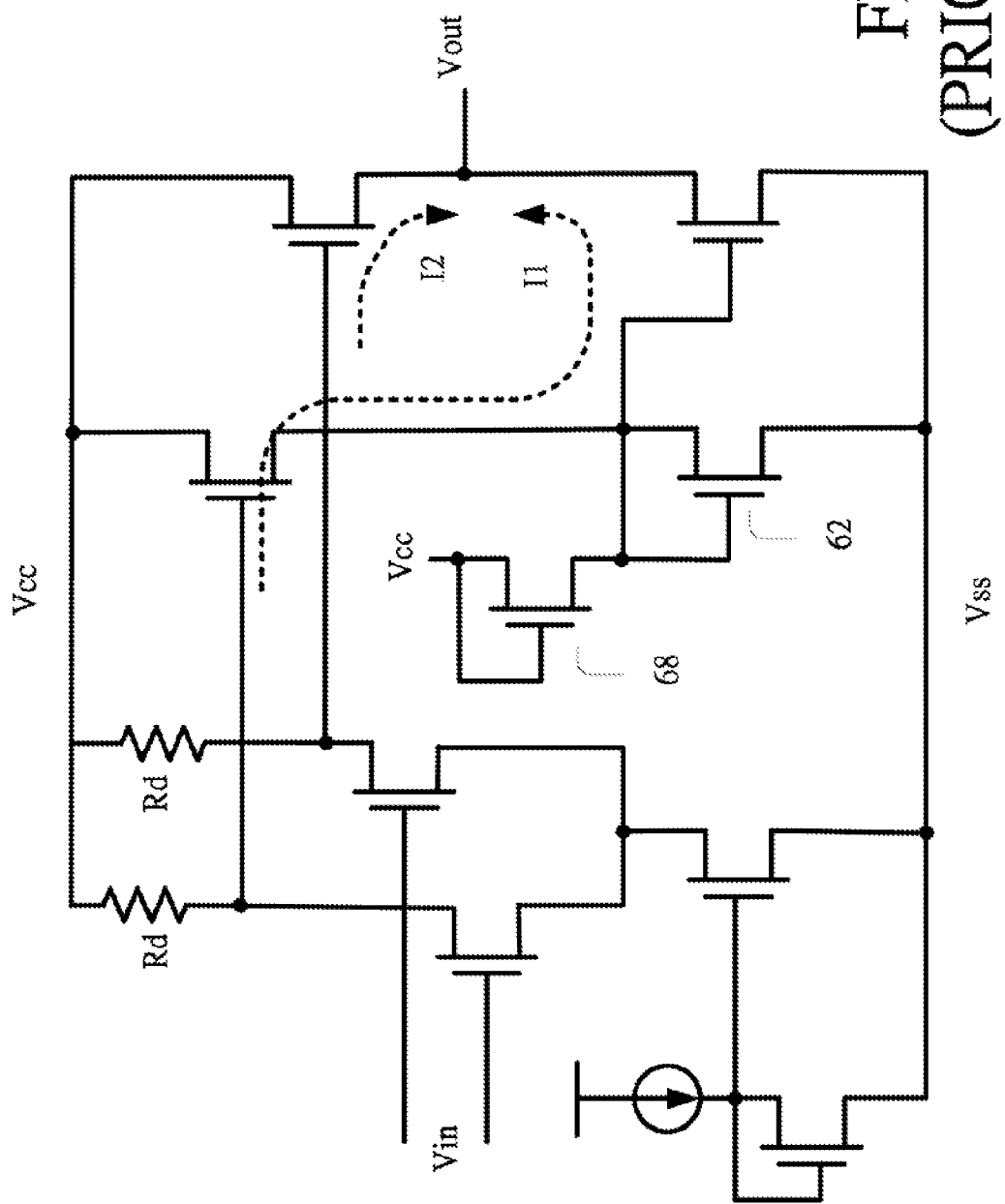
FIG. 3 is a diagram illustrating a conventional differential to single ended data conversion circuit
Figure 4:
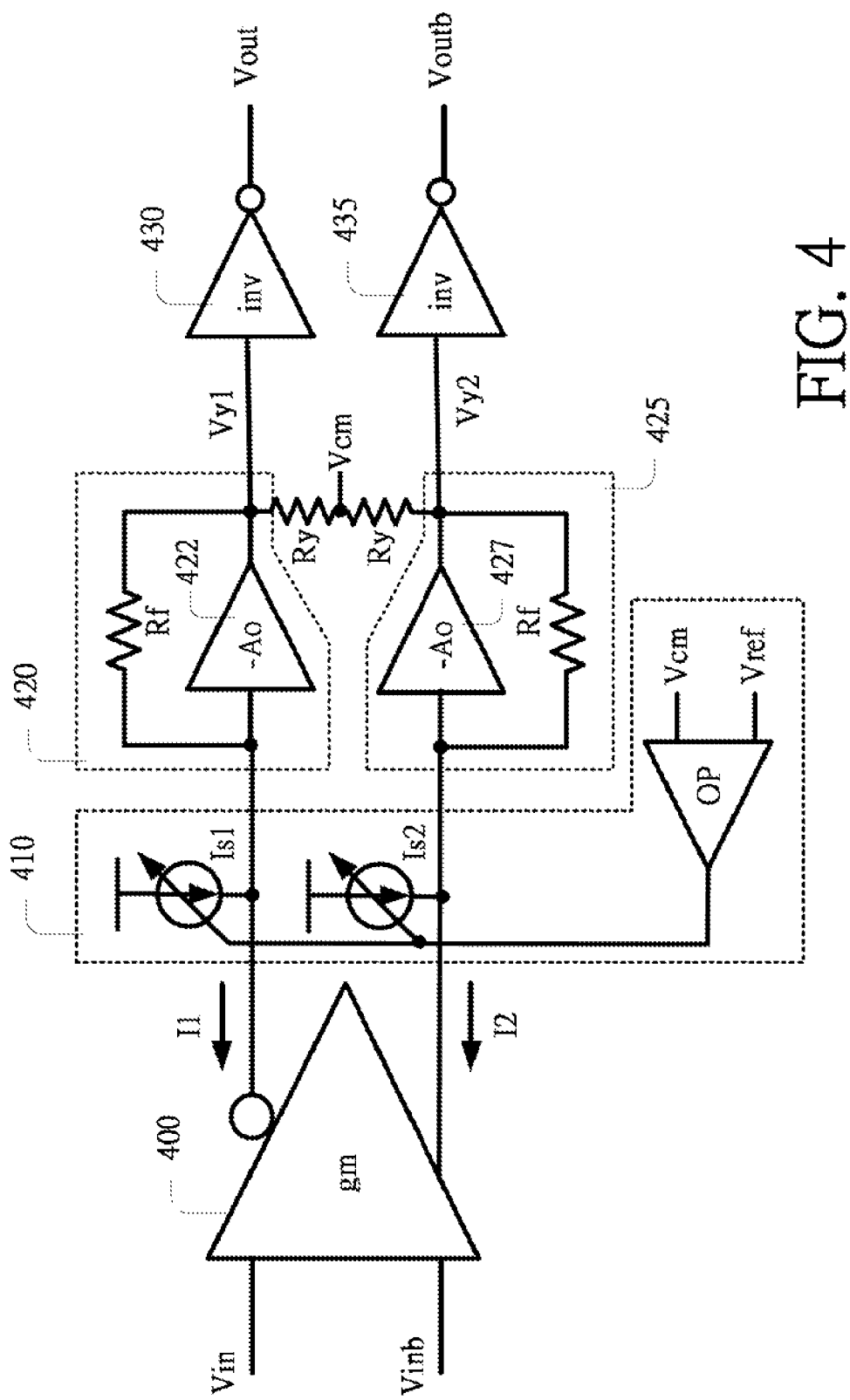
FIG. 4 is a diagram illustrating a differential to single ended converting circuit according to the present invention.

Refer to FIG. 4, which illustrates a differential to single ended converting circuit according to the present invention. The differential to single ended converting circuit comprises a transconductance circuit 400, an offset cancellation circuit 410, a first transimpedance circuit 420, a second transimpedance circuit 435, a firs inverter 430 and a second inverter 435.

The first transimpedance circuit 420 and the second transimpedance circuit 425 are totally the same in structure and are shut-shut feedback amplifier. In addition, the first transconductance circuit 420 comprises an amplifying unit 422 and a feedback resistance Rf wherein the amplifying unit 422 has an –Ao open loop gain and the feedback resistance Rf is connected between the input terminal and the output terminal of the amplifying unit 422. In the same way, the second transconductance circuit 425 comprises an amplifying unit 427 and a feedback resistance Rf wherein the amplifying unit 427 has an –Ao open loop gain and the feedback resistance Rf is connected between the input terminal and the output terminal of the amplifying unit 427.

The offset cancellation circuit 410 comprises two controllable current sources, i.e. Is1 and Is2, which are connected to the first current output terminal and the second current output terminal of the transimpedance circuit 400 respectively. Besides, the controllable current sources, Is1 and Is2, are controlled by an operational amplifier OP wherein the operational amplifier OP receives a common mode voltage Vcm and a reference voltage Vref and controls the controllable current sources, Is1 and Is2, according to the difference of the common mode voltage Vcm and the reference voltage Vref. Wherein the output terminal of the first transimpedance circuit 420 and the output terminal of the second transimpedance circuit 425 are connected by two resistors Ry. The node connected by two resistors Ry has a common mode voltage Vcm because the two resistors have the same resistance Ry. The main object of the offset cancellation circuit 410 is to control the transition points of the first transimpedance circuit 420, the second transimpedance circuit 425, the first inverter 430 and the second inverter 435 having a common mode voltage Vcm, and to equalize the duty cycle of the differential input voltages, i.e. Vin and Vinb, and the duty cycle of the single ended output voltages, i.e. Vout and Voutb.

The transconductance circuit 400 receives the differential input voltage, i.e. Vin and Vinb, and outputs a first current I1 and a second current I2 from a first current output terminal and a second current output terminal respectively. The first transimpedance circuit 420 which receives the superposition of the first current I1 and the controllable current source Is1 outputs a first voltage Vy1, while the second transimpedance circuit 425 which receives the superposition of the first current I2 and the controllable current source Is2 outputs a first voltage Vy2. And complementary single ended output voltage, i.e. Vout and Voutb, is generated after the first inverter 430 and the second inverter 435 receive the first voltage Vy1 and the second voltage Vy2 respectively.

Figure 5:
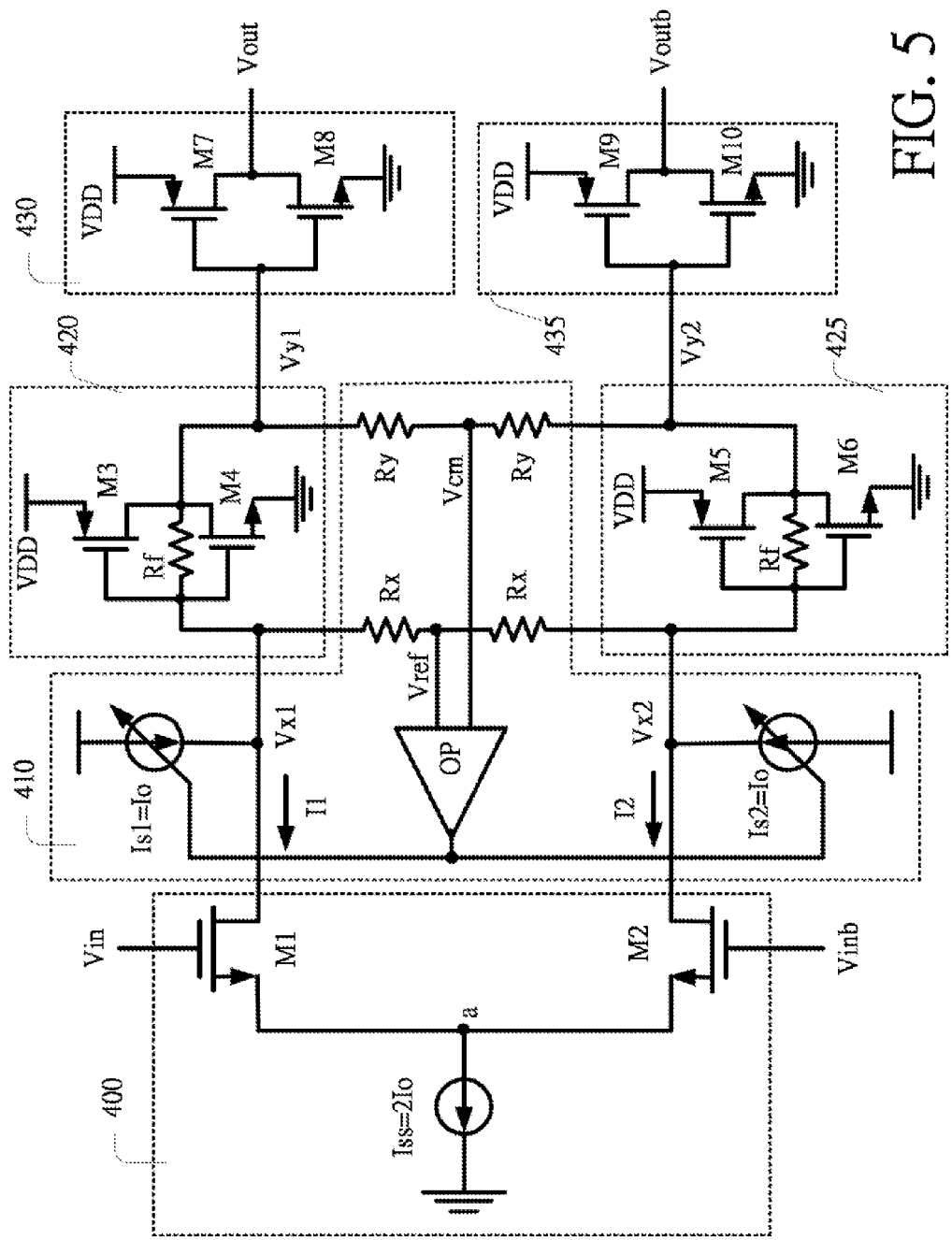
FIG. 5 is a diagram illustrating the detailed circuit of a differential to single ended converting circuit according to the present invention.

Refer to FIG. 5, which illustrates the detailed circuit of a differential to single ended converting circuit according to the present invention. The transconductance circuit 400 comprises a constant current Iss, a first transistor M1 and a second transistor M2, wherein the first transistor M1 and the second transistor M2 are n type transistors. The gate of the first transistor M1 and the gate of the second transistor M2 receive the differential input voltage, i.e Vin and Vinb, The source of the first transistor M1 and the source of the second transistor M2 are connected to node a. And the constant current source Iss which has a current value of 2*Io is connected between node a and the ground GND. In addition, the drain of the first transistor M1 and the drain of the second transistor M2 which are the first current output terminal and the second current output terminal respectively generate the first current I1 and the second current I2 respectively.

The first transimpedance circuit 420 comprises a third transistor M3, a fourth transistor M4 and a feedback resistor Rf, wherein the third transistor M3 is a p type transistor, while the fourth transistor M4 is a n type transistor. The third transistor M3 has a source connected to the voltage source VDD, a gate which is the input terminal of the first transimpedance circuit 420 connected to a first current output terminal, a drain which is the output terminal of the first transimpedance circuit 420 generating a first voltage Vy1. In addition, the fourth transistor M4 has a source connected to the ground GND, a gate connected to the gate of the third transistor M3, a drain connected to the drain of the third transistor M3. Moreover, the feedback resistor Rf is connected between the input terminal and the output terminal of the first transimpedance circuit 420. It is to be noted that the size ratio of the third transistor M3 and the fourth transistor M4 is k to 1.

The second transimpedance circuit 425 comprises a fifth transistor M5, a sixth transistor M6 and a feedback resistor Rf, wherein the fifth transistor M5 is a p type transistor, while the sixth transistor M6 is a n type transistor. The fifth transistor M5 has a source connected to the voltage source VDD, a gate which is the input terminal of the second transimpedance circuit 425 connected to a second current output terminal, a drain which is the output terminal of the second transimpedance circuit 425 generating a second voltage Vy2. In addition, the sixth transistor M6 has a source connected to the ground GND, a gate connected to the gate of the fifth transistor M5, a drain connected to the drain of the fifth transistor M5. Moreover, the feedback resistor Rf is connected between the input terminal and the output terminal of the second transimpedance circuit 425. It is to be noted that the size ratio of the fifth transistor M5 and the sixth transistor M6 is k to 1.

The offset cancellation circuit 410 comprises two controllable current sources, i.e. Is1 and Is2, which are connected to the first current output terminal and the second current output terminal of the transimpedance circuit 400 respectively. Besides, the controllable current sources, Is1 and Is2, are controlled by an operational amplifier OP wherein the operational amplifier OP receives a common mode voltage Vcm and a reference voltage Vref and controls the controllable current sources, Is1 and Is2, according to the difference of the common mode voltage Vcm and the reference voltage Vref. Wherein the output terminal of the first transimpedance circuit 420 and the output terminal of the second transimpedance circuit 425 are connected by two resistors Ry. The node connected by two resistors Ry has a common mode voltage Vcm because the two resistors have the same resistance Ry. Moreover, two resistors Rx are connected between the input terminal of the first transimpedance circuit 420 and the input terminal of the second transimpedance circuit 425. The node between two resistors Rx is set to have a reference voltage Vref. Under normal operation, the operational amplifier OP operates so that the common mode voltage Vcm and the reference voltage Vref are equal which results in the controllable current sources, Is1 and Is2, output the same current Io.

The first inverter 430 comprises the seventh transistor M7, and a eighth transistor M8 wherein the seventh transistor M7 is a p type transistor while the eighth transistor M8 is a n type transistor. The seventh transistor M7 has a source connected to the voltage source VDD, a gate which is the input terminal of the first inverter 430 receiving the first voltage Vy1, a drain which is the output terminal of the first inverter 430 generating a single ended output voltage Vout while the eighth transistor M8 has a source connected to the ground GND, a gate which is the input terminal of the first inverter 430 receiving the first voltage Vy1, a drain which is the output terminal of the first inverter 430 generating a single ended output voltage Vout. Moreover, when the size ratio of the seventh transistor M7 and the eighth transistor M8 is k to 1 which results in that the first transconductance circuit 420 and the first inverter 430 have the same transition point, i.e. the common mode voltage Vcm, the duty cycle of the differential input voltage, i.e. Vin and Vinb, and the duty cycle of the single ended output voltage, i.e. Vout are equal.

The second inverter 435 comprises the ninth transistor M9, and a tenth transistor M10 wherein the ninth transistor M9 is a p type transistor while the tenth transistor M10 is a n type transistor. The ninth transistor M9 has a source connected to the voltage source VDD, a gate which is the input terminal of the second inverter 435 receiving the second voltage Vy2, a drain which is the output terminal of the second inverter 435 generating a single ended output voltage Voutb while the tenth transistor M10 has a source connected to the ground GND, a gate which is the input terminal of the second inverter 435 receiving the second voltage Vy2, a drain which is the output terminal of the second inverter 435 generating a single ended output voltage Voutb. Moreover, when the size ratio of the ninth transistor M9 and the tenth transistor M10 is k to 1 which results in that the second transconductance circuit 425 and the second inverter 435 have the same transition point, i.e. the common mode voltage Vcm, the duty cycle of the differential input voltage, i.e. Vin and Vinb, and the duty cycle of the single ended output voltage, i.e. Voutb are equal.

Figure 6A:
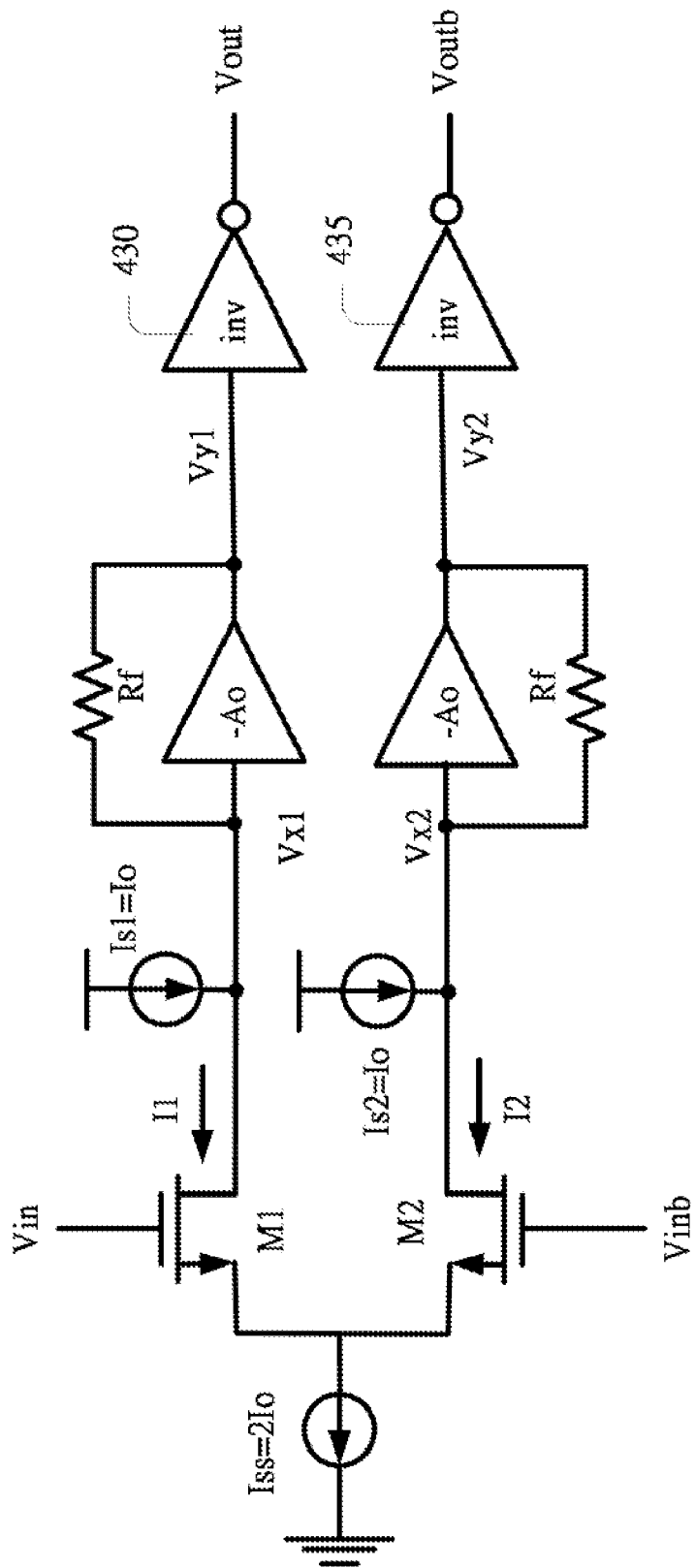
FIGS. 6A, 6B and 6C are diagrams illustrating the equivalent circuit when a differential to single ended converting circuit according to the present invention operates.
Figure 6B:
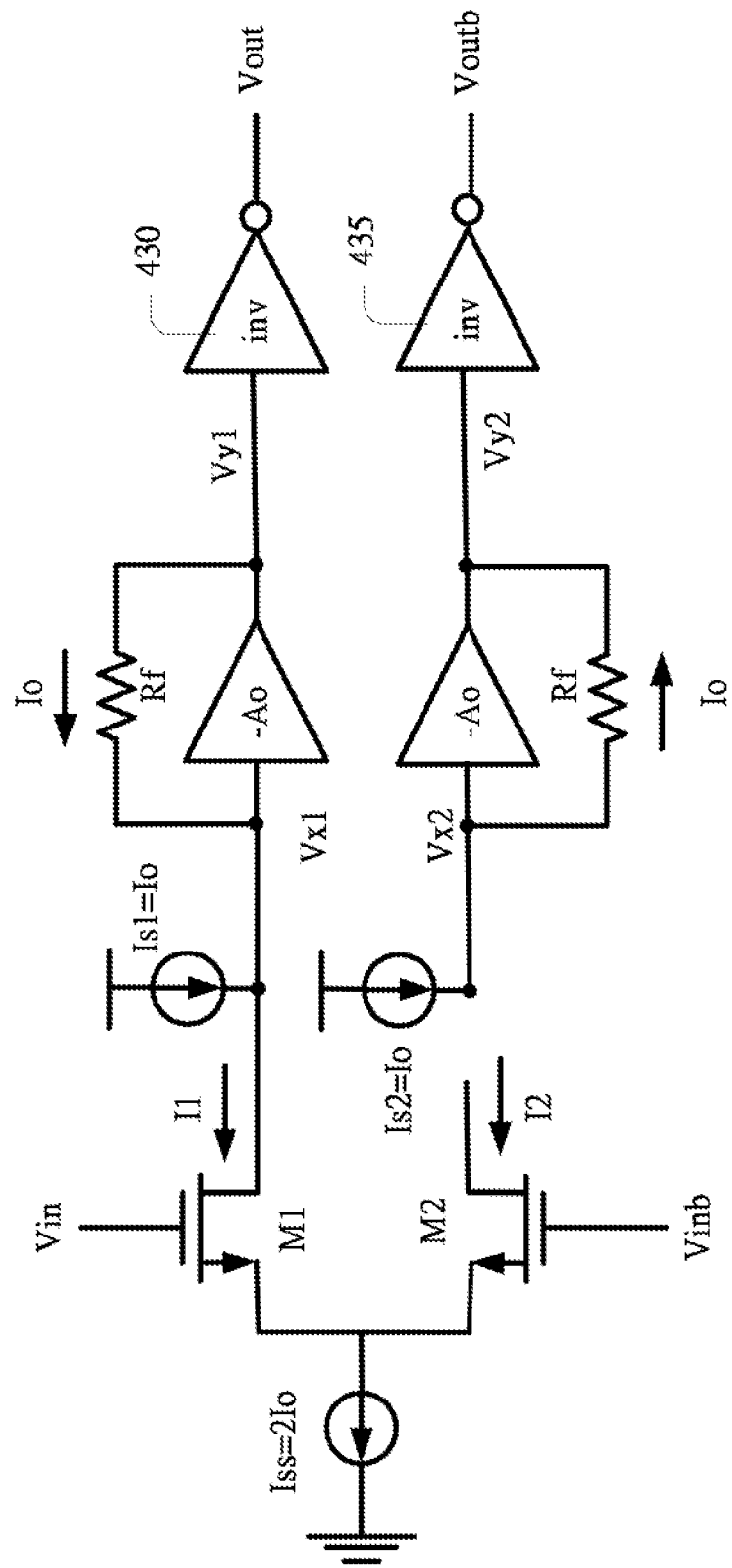
Figure 6C:
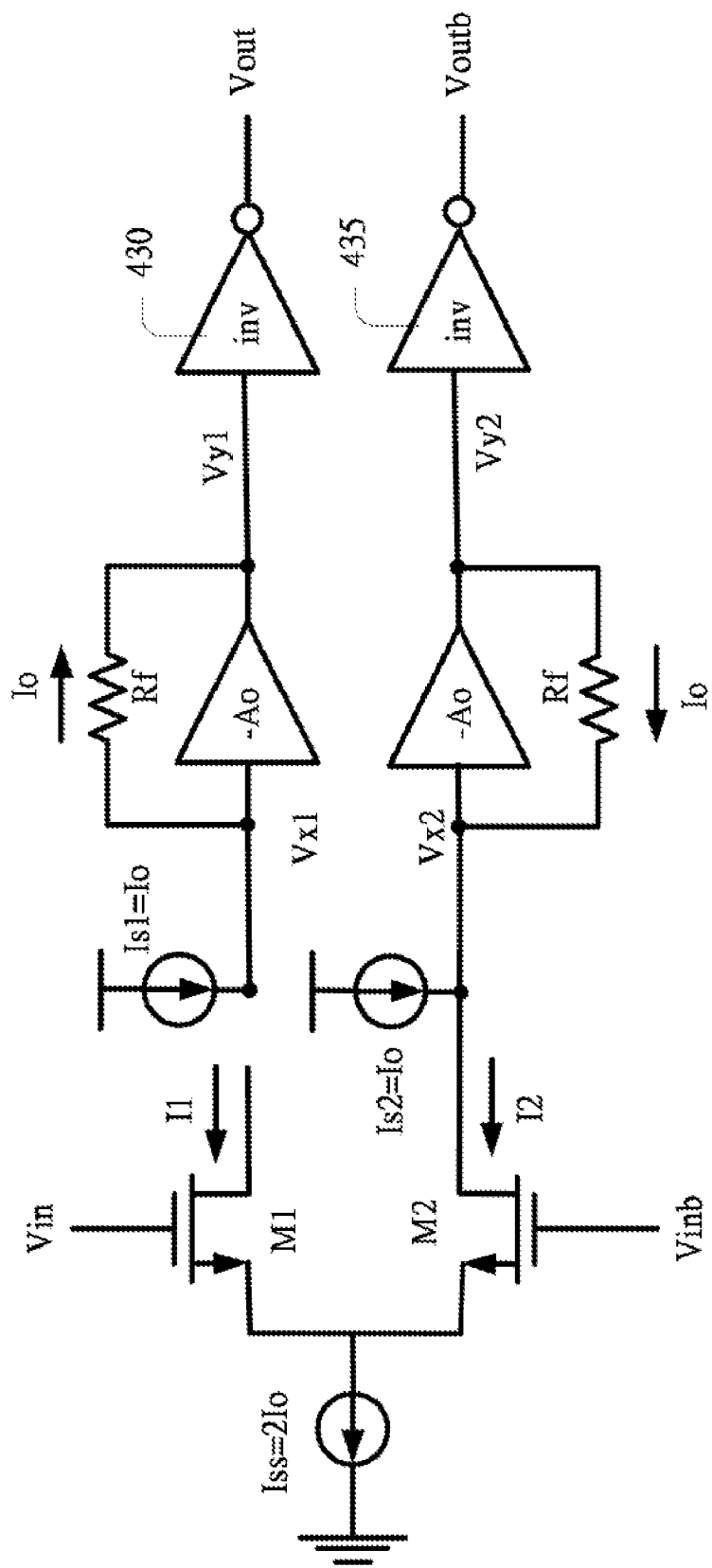

Refer to FIGS. 6A, 6B and 6C, which illustrate the equivalent circuit when a differential to single ended converting circuit according to the present invention operates.

Refer to FIG. 6A, which illustrates the equivalent circuit when the differential input voltage Vin equals the differential input voltage Vinb. The first transistor M1 and the second transistor M2 have turned on at the same time, the first current I1 which flows through the first transistor M1 and the second current I2 which flows through the second transistor M2 are equal to Io. Obviously, there are no currents flowing through the feedback Rf of the first transimpedance circuit 420 and the feedback Rf of the second transimpedance circuit 425 when the differential input voltages, i.e. Vin and Vinb, equals. Therefore, the input voltage Vx1 and output voltage Vy1 of the first transimpedance circuit 420 which are the same with the input voltage Vx2 and output voltage Vy2 of the second transimpedance circuit 425 has a common mode voltage Vcm. That is to say, Vx1=Vy1=Vx2=Vy2=Vcm.

Refer to FIG. 6B, which illustrates the equivalent circuit when the differential input voltage Vin is greater than the differential input voltage Vinb. The first transistor M1 has turned on while the second transistor M2 has turned off. In the meantime, the first current I1 which flows through the first transistor M1 equals to 2Io which results in an Io current flows from the output terminal of the first transimpedance circuit 420 to the input terminal of the first transimpedance circuit 420 by way of a feedback resister Rf. In addition, the second current I2 which flows through the second transistor M2 equals to zero resulting in an Io current flows from the input terminal of the second transimpedance circuit 425 to the output terminal of the second transimpedance circuit 425 by way of a feedback resister Rf. Therefore:

$Vx1=Vcm-Io*Rf/Ao;$ $Vy1=Vcm+Io*Rf;$ $Vx2=Vcm+Io*Rf/Ao;$ $Vy2=Vcm-Io*Rf.$

Furthermore, refer to FIG. 6C, which illustrates the equivalent circuit when the differential input voltage Vin is smaller than the differential input voltage Vinb. The first transistor M1 has turned off while the second transistor M2 has turned on. In the meantime, the second current I2 which flows through the second transistor M2 equals to 2Io which results in an Io current flows from the output terminal of the second transimpedance circuit 425 to the input terminal of the second transimpedance circuit 425 by way of a feedback resister Rf. In addition, the first current I1 which flows through the first transistor M1 equals to zero which results in an Io current flows from the input terminal of the second transimpedance circuit 425 to the output terminal of the second transimpedance circuit 425 by way of a feedback resister Rf. Therefore:

$Vx1=Vcm+Io*Rf/Ao;$ $Vy1=Vcm-Io*Rf;$ $Vx2=Vcm-Io*Rf/Ao;$ $Vy2=Vcm+Io*Rf.$

Figures 7A, 7B:
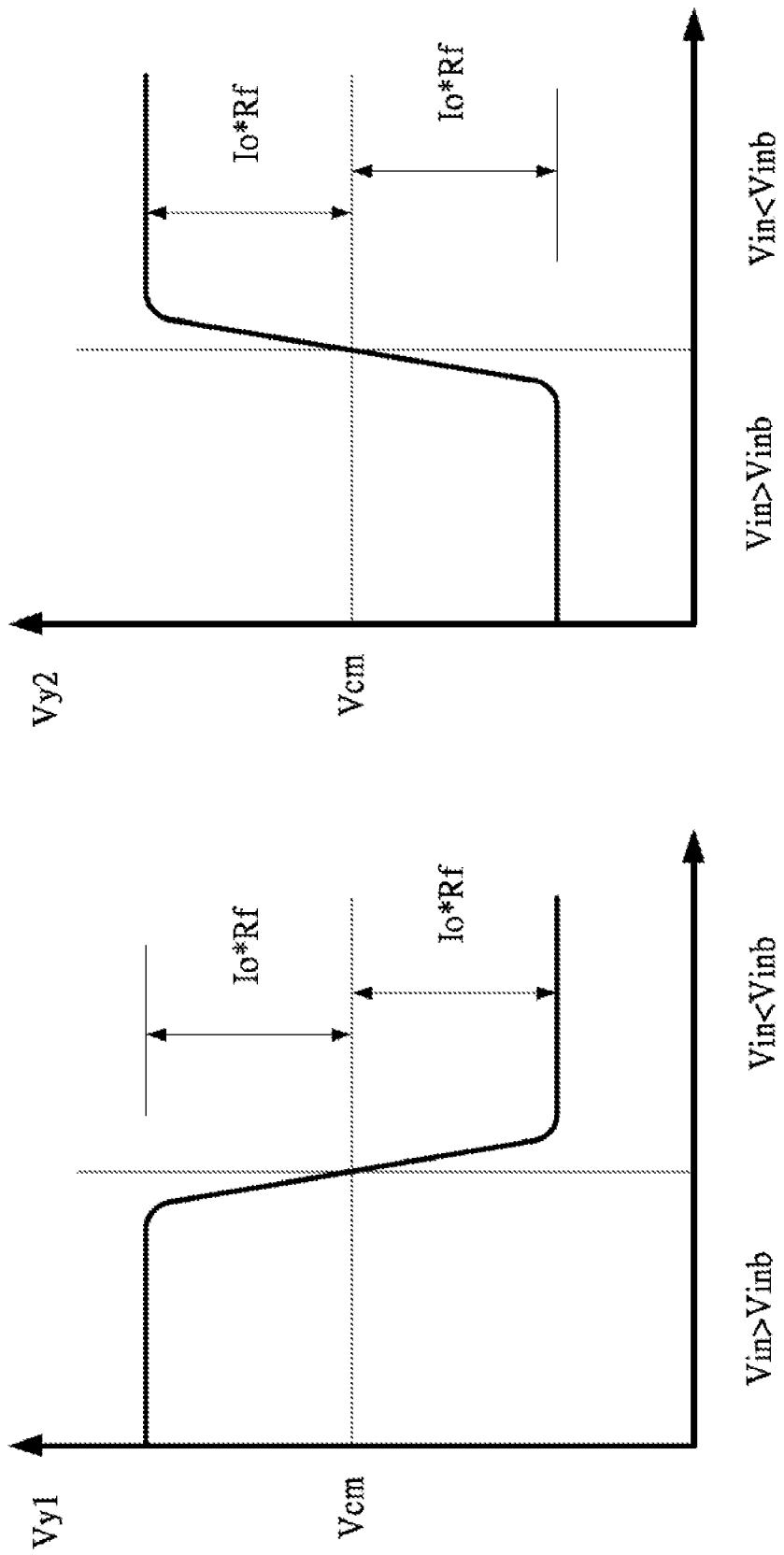
FIGS. 7A and 7B are diagrams illustrating transfer functions of the first transimpedance circuit and the second transimpedance circuit.

Please refer to FIGS. 7A and 7B, which illustrate the transfer functions of the first transimpedance circuit and the second transimpedance circuit. As shown in FIG. 7A, Vy1=Vcm+Io*Rf when the differential input voltage Vin is greater than the differential input voltage Vinb while Vy1=Vcm−Io*Rf when the differential input voltage Vin is smaller than the differential input voltage Vinb. As shown in FIG. 7B, Vy2=Vcm−Io*Rf when the differential input voltage Vin is greater than the differential input voltage Vinb while Vy2=Vcm+Io*Rf when the differential input voltage Vin is smaller than the differential input voltage Vinb.

Figures 8A, 8B:
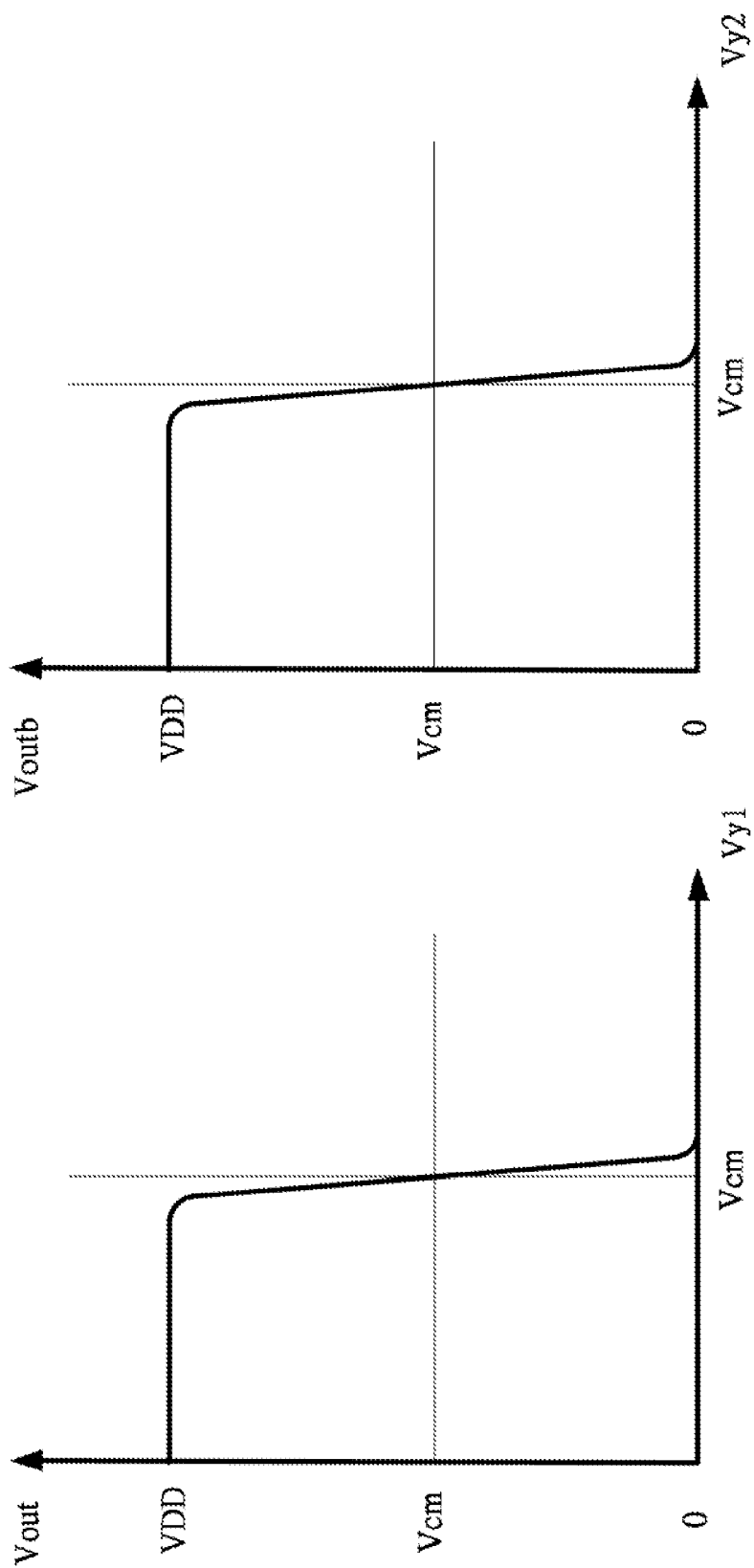
FIGS. 8A and 8B are diagrams illustrating the transfer functions of the first inverter and the second inverter.

Refer to FIGS. 8A and 8B, which illustrate the transfer functions of the first inverter and the second inverter. Because the first inverter and the second inverter are totally the same in structure, their transfer functions are also the same. According to the embodiment of the present invention, the size ratio of the p type transistors and the n type transistors in the first transimpedance circuit, the second transimpedance circuit, the first inverter, and the second inverter are all k to 1, the transition points of the first inverter and the second inverter have a common mode voltage Vcm. The first inverter and the second inverter invert and amplify the input signal so that the output signal has VDD voltage or GND voltage, i.e. full swing single ended output voltage. Moreover, the present invention may only adopt one of the first inverter and the second inverter to output the single ended output voltage.

Thus, the virtue of the present invention is providing a high speed differential to single ended converting circuit wherein the converting circuit doesn't adopt any diode connected transistor so that the While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A differential to single ended converting circuit, comprising:
   a transconductance circuit having two input terminals for receiving two differential input voltages and having a first current output terminal for outputting a first current and a second current output terminal for outputting a second current;
   an offset cancellation circuit having a first controllable current source connected to the first current output terminal and a second controllable current source connected to the second current output terminal;
   a first transimpedance circuit having an input terminal connected to the first current output terminal and an output terminal for outputting a first voltage;
   a second transimpedance circuit having an input terminal connected to the second current output terminal and an output terminal for outputting a second voltage; and
   a first inverter having an input terminal connected to the output terminal of the first transimpedance circuit and an output terminal for outputting a first single ended output voltage.

2. The differential to single ended converting circuit according to claim 1 further comprises a second inverter having an input terminal connected to the output terminal of the second transimpedance circuit and an output terminal for outputting a first single ended output voltage.

3. The differential to single ended converting circuit according to claim 1 wherein the transconductance circuit comprises a constant current source, a first transistor and a second transistor, wherein gates of the first transistor and the second transistor are as two output terminal of the transconductance circuit, sources of the first transistor and the second transistor are connected to a node, the constant current source is connected between the node and the ground, and drains of the first transistor and the second transistor are as the first current output terminal and the second current output terminal respectively.

4. The differential to single ended converting circuit according to claim 3 wherein the constant current source outputs 2*Io current.

5. The differential to single ended converting circuit according to claim 3 wherein the first transistor and the second transistor are n type transistors.

6. The differential to single ended converting circuit according to claim 1 wherein the offset cancellation circuit comprises the said two controllable current sources and an operational amplifier for receiving a common mode voltage and a reference voltage and adjusting the said two controllable current sources according to the difference of the common mode voltage and the reference voltage.

7. The differential to single ended converting circuit according to claim 6 wherein the offset cancellation circuit further comprises a first resistor and a second resistor connected to the output terminal of the first transimpedance circuit and the output terminal of the second transimpedance circuit respectively, wherein the first resistor and the second resistor have same resistance and the connected node of the first resistor and the second resistor has the common mode voltage.

8. The differential to single ended converting circuit according to claim 6 wherein a third resistor and a fourth resistor connected to the input terminal of the first transimpedance circuit and the input terminal of the second transimpedance circuit respectively, wherein the third resistor and the fourth resistor have same resistance and the connected node of the third resistor and the fourth resistor has the reference voltage.

9. The differential to single ended converting circuit according to claim 6 wherein the operational amplifier adjusts the two controllable current sources so that each of the two controllable current sources has a Io current.

10. The differential to single ended converting circuit according to claim 1 wherein the first transimpedance circuit and the second transimpedance circuit are shut-shut feedback amplifiers.

11. The differential to single ended converting circuit according to claim 1 wherein the first transimpedance circuit comprises an amplifying unit and a feedback resistance Rf wherein the input terminal of the amplifying unit is as the input terminal of the first transimpedance circuit while the output terminal of the amplifying unit is as the output terminal of the first transimpedance, the amplifying unit has an −Ao open loop gain and the feedback resistance Rf is connected between the input terminal and the output terminal of the amplifying unit.

12. The differential to single ended converting circuit according to claim 11 wherein the amplifying unit comprises a third transistor and a fourth transistor wherein the third transistor has a source connected to a voltage source, a gate which is as the input terminal of the first transimpedance circuit, and a drain which is as the output terminal of the first transimpedance circuit while the fourth transistor has a source connected to the ground, a gate which is the input terminal of the first transimpedance circuit, and a drain which is the output terminal of the first transimpedance circuit.

13. The differential to single ended converting circuit according to claim 12 wherein the third transistor is a p type transistor while the fourth transistor is a n type transistor and the size ratio of the third transistor and the fourth transistor is k to 1.

14. The differential to single ended converting circuit according to claim 1 wherein the first inverter comprises a seventh transistor, and a eighth transistor, wherein the seventh transistor has a source connected to the voltage source, a gate which is as the input terminal of the first inverter, a drain which is as the output terminal of the first inverter while the eighth transistor has a source connected to the ground, a gate which is as the input terminal of the first inverter, a drain which is the output terminal of the first inverter.

15. The differential to single ended converting circuit according to claim 14 wherein the seventh transistor is a p type transistor while the eighth transistor is a n type transistor, and the size ratio of the seventh transistor and the eighth transistor is k to 1.

* * * * *